US007005744B2

(12) United States Patent
Chen et al.

(10) Patent No.: US 7,005,744 B2
(45) Date of Patent: Feb. 28, 2006

(54) CONDUCTOR LINE STACK HAVING A TOP PORTION OF A SECOND LAYER THAT IS SMALLER THAN THE BOTTOM PORTION

(75) Inventors: Xiangdong Chen, Poughquag, NY (US); Li Wang, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,308

(22) Filed: Sep. 22, 2003

(65) Prior Publication Data

US 2005/0062161 A1    Mar. 24, 2005

(51) Int. Cl.
*H01L 29/41* (2006.01)
*H01L 29/49* (2006.01)

(52) U.S. Cl. .............. 257/755; 257/296; 257/413
(58) Field of Classification Search ............ 257/758, 257/775, 754–755, 296, 413; 438/182, 574, 438/579
See application file for complete search history.

(56) References Cited

U.S. PATENT DOCUMENTS

| 4,906,589 A | * | 3/1990 | Chao ........................ 438/305 |
| 4,907,048 A | * | 3/1990 | Huang ....................... 257/344 |
| 5,053,849 A | * | 10/1991 | Izawa et al. ............... 257/401 |
| 5,061,647 A | * | 10/1991 | Roth et al. ................ 438/304 |
| 5,146,291 A | * | 9/1992 | Watabe et al. ............. 257/344 |
| 5,175,119 A | * | 12/1992 | Matsutani .................. 438/290 |
| 5,241,203 A | * | 8/1993 | Hsu et al. .................. 257/344 |
| 5,256,585 A | * | 10/1993 | Bae ............................ 438/304 |
| 5,276,347 A | * | 1/1994 | Wei et al. ................... 257/388 |
| 5,368,686 A | * | 11/1994 | Tatsumi et al. ............. 438/696 |
| 5,374,575 A | * | 12/1994 | Kim et al. .................. 438/291 |
| 5,502,336 A | * | 3/1996 | Park et al. .................. 257/754 |
| 5,521,115 A | * | 5/1996 | Park et al. .................. 438/243 |
| 5,643,833 A | * | 7/1997 | Tsukamoto ................ 438/636 |
| 5,986,305 A | * | 11/1999 | Wu ............................ 257/344 |
| 5,994,192 A | * | 11/1999 | Chen .......................... 438/303 |
| 6,001,719 A | * | 12/1999 | Cho et al. ................... 438/592 |
| 6,180,474 B1 | * | 1/2001 | Kim ........................... 438/304 |

(Continued)

FOREIGN PATENT DOCUMENTS

JP          2004-146839     *    5/2004

OTHER PUBLICATIONS

D.S. Wen et al., A Self-Aligned Inverse-T Gate Fully Over-lappsed LDD for Sub-Half Micron CMOS. IEDM 1989, pp. 765-768.*

(Continued)

*Primary Examiner*—Anh Duy Mai
(74) *Attorney, Agent, or Firm*—H. Daniel Schnurmann (57) ABSTRACT

A structure and method are provided for a conductor line stack of an integrated circuit. The conductor line stack includes a layer of a first material such as heavily doped polysilicon or a metal silicide. A layer of a second material such as a metal is formed over the layer of first material, the layer of second material having an upper portion and a lower portion. A pair of first spacers is disposed on sidewalls of the upper portion, wherein the lower portion has width defined by a combined width of the upper portion and the pair of first spacers. A pair of second spacers is formed on sidewalls of the first spacers, the lower portion and the layer of first material. The conductor line stack structure is well adapted for formation of a borderless bitline contact in contact therewith.

20 Claims, 6 Drawing Sheets

U.S. PATENT DOCUMENTS

| | | | |
|---|---|---|---|
| 6,235,621 B1 * | 5/2001 | Jeng et al. | 438/592 |
| 6,245,620 B1 * | 6/2001 | Jang et al. | 438/303 |
| 6,261,933 B1 | 7/2001 | Hakey et al. | |
| 6,274,441 B1 * | 8/2001 | Mandelman et al. | 438/286 |
| 6,319,840 B1 | 11/2001 | Costrini et al. | |
| 6,331,478 B1 * | 12/2001 | Lee et al. | 438/592 |
| 6,342,450 B1 * | 1/2002 | Lattard | 438/696 |
| 6,426,247 B1 * | 7/2002 | Divakaruni et al. | 438/185 |
| 6,437,411 B1 * | 8/2002 | Choi et al. | 257/413 |
| 6,660,581 B1 * | 12/2003 | Yang et al. | 438/242 |
| 6,674,139 B1 * | 1/2004 | Mandelman et al. | 257/412 |
| 6,723,623 B1 * | 4/2004 | Nguyen | 438/525 |
| 6,730,552 B1 * | 5/2004 | Abadeer et al. | 438/197 |
| 6,740,550 B1 * | 5/2004 | Choi et al. | 438/199 |
| 6,878,613 B1 * | 4/2005 | Stottko et al. | 438/592 |
| 6,885,052 B1 * | 4/2005 | Ahn et al. | 257/296 |
| 2001/0038113 A1 * | 11/2001 | Bronner et al. | 257/301 |
| 2001/0046737 A1 * | 11/2001 | Ahn et al. | 438/253 |
| 2002/0055224 A1 * | 5/2002 | Mandelman et al. | 438/243 |
| 2002/0072156 A1 * | 6/2002 | Lee et al. | 438/151 |

OTHER PUBLICATIONS

J.R. Pfiester et al., A Self-Aligned LDD/Channel Implanted ITLDD Process with Selectively-Deposited Poly Gates for CMOS VLSI. IEDM 1989, pp. 769-772.*

* cited by examiner

CONDUCTOR LINE STACK HAVING A TOP PORTION OF A SECOND LAYER THAT IS SMALLER THAN THE BOTTOM PORTION

BACKGROUND OF INVENTION

The present invention is related to integrated circuits and their fabrication. More specifically, the invention relates to a structure and method of fabricating a conductor line (e.g. gate conductor, wordline, etc.) for improving process tolerances in providing borderless contacts.

As described below, the present invention is directed to forming an improved conductor line structure of an integrated circuit (IC) which provides increased process tolerance for forming a borderless contact to a semiconductor substrate. The present invention is especially well-suited for fabrication of wordlines and borderless bitline contacts of a dynamic random access memory (DRAM).

Dynamic random access memories (DRAMs) include very densely packed arrays of semiconductor devices which are accessed by wordlines running in a first horizontal direction over the major surface of a substrate, and a set of bitlines which run in a second horizontal direction over the major surface of the substrate. In a typical DRAM, a wordline is activated by raising its voltage to access a row of storage cells of a data storage array. When a particular row is accessed by an activated wordline, a bitline is used to read a data bit signal of a storage cell of that accessed row. This is done by transferring a charge stored in the storage cell to a sense amplifier. A bitline is used to write a data bit signal of a storage cell of the accessed row by transferring and storing a charge from the sense amplifier to the storage cell. Storage cells of a DRAM require periodic refreshing to avoid loss of the data stored therein. To refresh a storage cell, the bitline transfers the charge stored in the storage cell to the sense amplifier, amplifies it there to a desirable level, and then rewrites the storage cell with the same data by transferring the amplified charge back to the storage cell.

In many DRAMs, wordlines have an encapsulated structure including a linearly extending conductor and an insulative structure encapsulating the top and sidewalls of the conductor. The insulative structure typically includes an insulating cap and insulating spacers. Silicon nitride is a typical material for providing an insulating cap. Silicon nitride and/or silicon dioxide are typically used for providing insulating spacers. The linearly extending conductor generally includes heavily doped polysilicon and/or one or more metals and/or one or more compounds of metals, especially metal silicides. One or more barrier layers and/or adhesion layers may also be included within the conductor for enhancing performance.

DRAMs having high integration density typically require wordlines to be encapsulated to support tight wordline pitch. Tight wordline pitch is also needed for best signal transfer on bitlines, because bitlines are shorter when wordlines have tight pitch, and shorter bitlines have less parasitic capacitance to interfere with signal transfer. When wordlines are spaced very close together, i.e. at any spacing less than about 1½ times the minimum lithographic feature size or spacing (F) for the technology, the bitline contacts must be self-aligned to the insulative material which encapsulates the wordlines. The wordline to wordline spacing is typically set to the minimum spacing of 1 F, i.e. at the critical dimension. Because of difficulties in achieving perfect alignment between the critical dimensioned bitline contact mask and the underlying critical dimensioned pattern, the minimum sized holes (of 1 F size) that are etched to form the bitline contacts would be subject to landing on tops and/or sidewalls of the conductive wordlines. The bitline contacts formed by depositing a conductive material in the contact holes would then short circuit to the wordlines. Hence, wordlines must have conductors which are encapsulated both on their sides and top to prevent such shorting. Bitline contacts are then formed between such encapsulated wordlines which are self-aligned to the opening between the insulative material that encapsulates the wordlines.

Such self-aligned process for forming bitline contacts between encapsulated wordlines is known as a borderless bitline contact process. Some processes for forming borderless bitline contacts are described in U.S. Pat. Nos. 6,319,840 and 6,261,933. As described in U.S. Pat. No. 6,319,840, a bitline contact is formed in a self-aligned manner between two encapsulated wordlines. As used herein, the term "horizontal" means any direction which is parallel to the major surface of a semiconductor substrate, whereas "vertical" means a direction which is perpendicular to that major surface. As shown in that patent in FIG. 1A, a plurality of patterned conductive lines 14 are provided which run in a first horizontal direction over a major surface 11 of a single-crystal semiconductor region of a substrate 10. Conductive lines 14 can be both wordlines and gate conductors of a memory array, when the channel regions of transistors of the memory array are located below a layer 12 of gate dielectric and oriented in a direction parallel to the major surface of the substrate. Alternatively, the conductive lines 14 can be merely wordlines of a memory array, as connected to gate conductors of transistors having vertically oriented channels formed below the major surface of the substrate. In such case, layer 12 may be used as an array top oxide rather than a gate dielectric. Each patterned conductor line 14 includes sidewall spacers 16 that are formed on each side of the patterned conductive line.

Figure 1A:
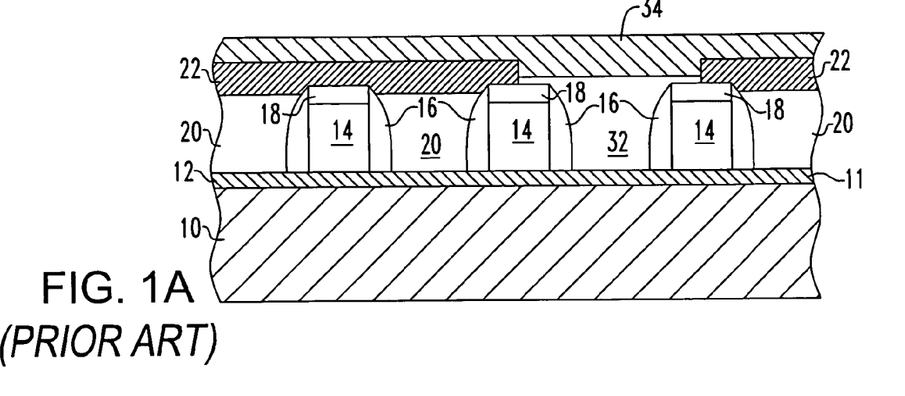
FIG. 1A is a cross-sectional view illustrating a prior art structure including a borderless bitline contact formed between a pair of conductor lines.

To form the borderless bitline contact, a contact hole is first etched in a dielectric region between two wordlines 14 to reach the single-crystal semiconductor region 10 below the wordlines. The etch process is generally but not completely selective to the material of the insulating sidewall spacers 16 and the insulating cap 18 that together encapsulate the wordline. Thereafter, heavily doped polysilicon is deposited in contact with the exposed single-crystal silicon to form a borderless bitline contact that is self-aligned to the encapsulated wordlines.

As the chip area occupied by a DRAM is reduced from one technology generation to the next, the minimum lithographic feature size F (equivalent to minimum spacing) is also reduced such that there is less space available for accommodating both the bitline contact and the sidewall spacers disposed to the sides of the bitline contact.

It is apparent that there is a minimum thickness for the sidewall spacers formed on the conductor line, below which poor results are obtained. While the bitline contact holes are formed by etching selectively to the material of the spacers, the selectivity is not complete, such that the thickness of the spacer is reduced somewhat during the etch. If the resulting sidewall spacers become too thin, then capacitance between the wordline and bitline can increase up to several times the desired maximum capacitance, which degrades the quality of the bitline signal. If a spacer becomes thinned, i.e., etched through, to the point that the bitline comes in conductive contact with the wordline, the bitline will short circuit to the wordline.

Figure 1B:
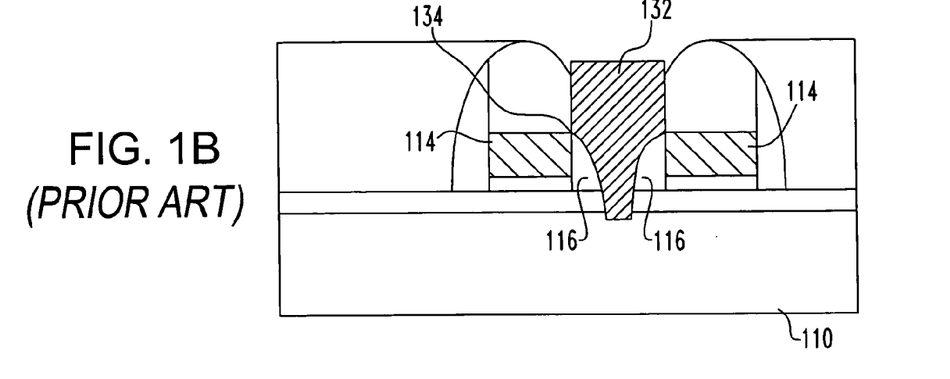
FIG. 1B is a cross-sectional view illustrating a problem of the prior art in which a borderless bitline contact formed between a pair of conductor lines conductively contacts (i.e., is short-circuited to) one of the conductor lines.

FIG. 1B is a cross-sectional diagram illustrating this problem. When the minimum feature size F for lithographically patterning structures of a DRAM is decreased below 100 nm, the thickness of spacers 116 can be too thin to prevent undesired conductive contact between metal layers 114 of wordlines having width of the minimum feature size F and the bitline contact 132. Such undesired contact causes a short circuit between the particular wordline and the bitline, causing at least the bitline to become inoperative and, often the wordline as well (depending on the technique used for bitline sparing). The most probable location for the undesired contact to occur is the top corner 134.

On the other hand, it is apparent that there is little tolerance for increasing the thickness of the sidewall spacers. When the sidewall spacers are too thick, poor contact (highly resistive) or nonexistent contact will be made between the bitline contact and the drain of the transistor that is formed in the single-crystal semiconductor region 110 of the substrate. Such condition, known as "bitline contact open" must be avoided.

The thickness of the sidewall spacer is also limited for other reasons. In addition to the memory array, every DRAM, including standalone DRAMs and DRAMs which are embedded in chips having additional function, e.g. a processor, includes other "support" transistors which are optimized for certain performance such as switching, drive and/or gain. The sidewall spacers of transistors in the memory array are formed at the same time and by the same process as the sidewall spacers of such support transistors. The support transistors require the sidewall spacers to remain relatively thin for performance reasons. For one, the sidewall spacers need to relatively thin in order to allow implants and other processes to be performed in close proximity to the channel regions of the transistors.

The spacer thickness is a very important process parameter for planar device performance. The spacer thickness affects the threshold voltage, leakage current, and drive current of planar transistors, e.g. planar passgate transistors for the memory cell array and support circuit devices. The sidewall spacers cannot be thickened in the memory cell array without impacting the performance of support transistors. Accordingly, the sidewall spacer thickness must be maintained within the tolerances for fabricating the support transistors.

Figure 2:
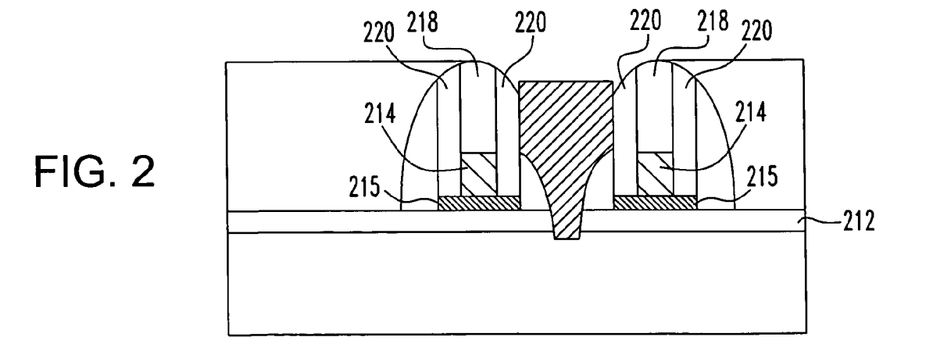
FIG. 2 is a cross-sectional view a structure formed according to a method which is background to the present invention, but which is not admitted to be prior art.

FIG. 2 illustrates one approach for addressing the possibility of shorting between wordline and bitline contact. The approach described here is background to the present invention but is not admitted to be prior art. In this approach, an upper (metallic or metal compound) layer or layers 214 of the conductor line stack is defined as a narrower structure than the lowest layer 215, which is composed of a different material such as doped polysilicon. In such approach, the conductive stack including the lowest layer 215 and the upper layer 214 can be formed by photolithographically patterning a resist layer to have 1 F width, and then performing a vertical etch, such as a reactive ion etch (RIE), stopping on the underlying oxide layer 212. A subsequent process can then be performed, such as a mask open process to first thin the profile of the insulating cap 218 and then etch the upper layer 214 selective to the polysilicon of the lowest layer 215, to decrease the width of the upper layer 214.

However, this approach leaves much to be desired. When the upper layer of the wordline line is made narrower, higher resistance results because the portion of the wordline containing the metal(s) and/or metal compound(s) has smaller cross-sectional area. The higher resistance causes higher propagation delay along the wordline, which degrades the speed of the circuit. A second problem is that the performance of memory array transistors coupled to the wordline is sensitive to the thickness of the spacers 220. As described above, the sidewall spacer cannot be thickened without limit, in order to avoid affecting the performance of the support transistors. Rather, the sidewall spacer thickness must be maintained within the tolerances provided therefor, and little margin is provided for variation.

In view of the foregoing, it would be desirable to provide a structure and method of forming a conductor line which improves process tolerance for forming borderless bitline contacts.

It would further be desirable to provide a structure and method of forming a conductor line having a layer including a metal and/or metal silicide which provides improved process tolerance while maintaining resistance tolerably low.

SUMMARY OF INVENTION

According to an aspect of the invention, a structure and method are provided for a conductor line stack of an integrated circuit. The conductor line stack includes a layer of a first material such as heavily doped polysilicon and/or a metal silicide. A layer of a second material such as a metal is formed over the layer of first material, the layer of second material having an upper portion and a lower portion. A pair of first spacers is disposed on sidewalls of the upper portion, wherein the lower portion has width defined by a combined width of the upper portion and the pair of first spacers.

According to a preferred aspect of the invention, a pair of second spacers is formed on sidewalls of the first spacers, the lower portion and the layer of first material.

According to another preferred aspect of the invention, the conductor line stack structure is suited to formation of a borderless bitline contact in contact therewith.

According to yet another preferred aspect of the invention, a conductor contact structure is provided. The conductor contact structure includes a pair of conductor line stacks oriented in parallel, wherein each conductor line stack includes a layer of a first material selected from heavily doped polysilicon and a metal silicide; and a layer of metal formed on the layer of first material, the layer of metal having an upper portion and a lower portion.

In such preferred aspect of the invention, each conductor line stack further includes an insulating cap formed over the layer of metal; and a pair of first spacers disposed on sidewalls of the upper portion and the insulating cap, the lower portion having width defined by a combined width of the upper portion and the pair of first spacers. A pair of second spacers is disposed on sidewalls of the first spacers, on sidewalls of the lower portion and on sidewalls of the layer of first material.

According to a preferred aspect of the invention, a borderless bitline contact to a single-crystal semiconductor region is disposed below the pair of conductor line stacks, the bitline contact contacting sidewalls of the second spacers of the conductor line stacks, such that a conductor line stack of the pair is separated from the single-crystal semiconductor region by an array top oxide layer and another conductor line stack of the pair is conductively coupled to a gate conductor of a vertical pass-gate transistor of a dynamic random access memory.

DETAILED DESCRIPTION

By the present invention, an improved conductor line structure is provided which decreases the proximity between the metal layer of the conductor line and a borderless contact that is formed adjacent to the conductor line. In such manner, the tendency of the conductor line to become short-circuited to the borderless contact as a result of the minimum feature size of the technology being reduced.

The conductor line is improved in this manner while maintaining resistance within a tolerable range. This is accomplished by processing the metal layer of the conductor line in two portions. An upper portion of the metal layer has reduced width such that proximity between the upper portion and the bitline contact is increased. Resistance is kept within tolerable limits by fabricating a lower portion of the metal layer having a larger width which is preferably equal to the width of a polysilicon layer of the conductor line that is formed below the metal layer.

Figure 3A:
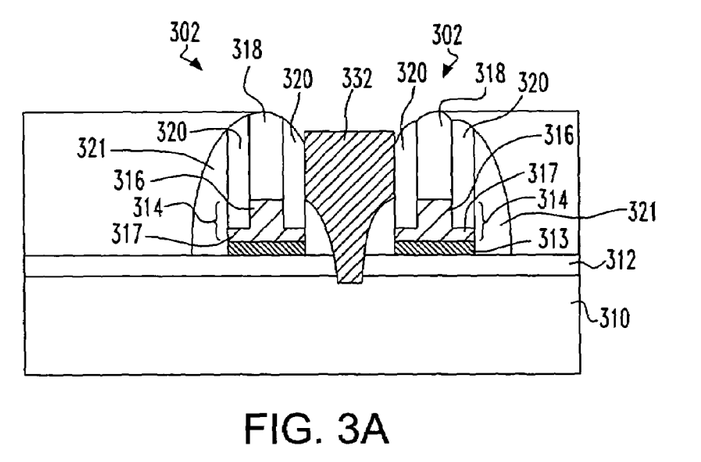
FIG. 3A is a cross-sectional view illustrating a pair of conductor lines according to an embodiment of the invention, as combined with a borderless bitline contact disposed between the pair.

Embodiments of the invention will now be described in relation to the figures which illustrate preferred structures and methods for implementing the invention. FIG. 3A illustrates, in cross-section, the structure of a pair of conductor lines according to an embodiment of the invention in which a borderless bitline contact 332 to the substrate 310 is formed between the pair of conductor lines.

Substrate 310 employed in the present invention can include any semiconducting material, including, but not limited to: Si, Ge, SiGe, GaP, InAs, InP and all other III/V compound semiconductors. The substrate may also be composed of a layered semiconductor such as Si/SiGe, Si/SiO$_2$/Si or silicon-on-insulator (SOI) having a single-crystal semiconductor region as an uppermost layer. The substrate may be of n-type or p-type conductivity depending on the type of device or devices to be fabricated. Moreover, the substrate may contain various isolation regions such as shallow trench isolation (STI) regions, LOCOS (local oxidation of silicon) regions or other like isolation regions either formed in the substrate or on a surface thereof. Typically, a dielectric layer 312 separates the conductor lines 302 from the surface of the substrate 310. The substrate most preferably includes an upper region of single-crystal silicon in contact with the dielectric layer 312. In an embodiment in which the conductor lines 302 function as gate conductors of insulated gate field effect transistors ("IGFETs" or commonly "FETs"), the dielectric layer 312 is a thin layer which functions as a gate dielectric for planar transistors of a storage cell array. In another embodiment, the dielectric layer 312 can be a thicker array top oxide layer which functions as an isolation layer for drain regions of vertically oriented transistors of a storage cell array.

Each conductor line preferably includes a layered stack including a lowest layer of doped polysilicon 313 and one or more layers 314 of metals and/or one or more compounds of metals, especially metal silicides. For ease of reference, such layer or layers 314 of metal(s) and/or metal compound(s) is hereinafter referred to as a "metal layer." An optional barrier layer comprising tungsten nitride (WN), titanium nitride (TiN) or tantalum nitride (TaN), for example, may be formed between the doped polysilicon layer 313 and the conductive metal and/or metal compound layer(s) 314.

As further shown in FIG. 3A, the metal layer 314 has an upper portion 316 and a lower portion 317. A dielectric cap 318, preferably including silicon nitride, is disposed in contact with the upper portion 316 of each conductor line 302. The upper portion 316 is narrower than the lower portion 317 by the width of spacers 320 that are formed on sidewalls of the cap 318 and upper portion 316. The lower portion 317 preferably has the same width as the polysilicon layer 313 that contacts dielectric layer 312 below.

As further shown in FIG. 3A, because the upper portions 316 of a pair of conductor line structures 302 having reduced width, more space is now available for providing a borderless conductive contact 332 between the pair to the substrate 310 relative to that described above with reference to FIG. 1B. In addition, the conductive contact 332 is better isolated from the metal layer 314 of the conductor line 312 by a spacer 320 having increased thickness relative to that shown in FIG. 1B.

Also, since the metal layer 314 has a lower portion 317 which spans the width of the polysilicon layer 313 below, the metal layer 314 can be formed to have lower resistance, in two ways, than the metal layer 214 of the conductor line structure described above relative to FIG. 2. First, the metal layer 314 has lower sheet resistance in the direction of its length (i.e. in the direction into and out of the page) because it has greater cross-sectional area. Barring any change in the vertical thickness of the metal layer 314, the cross-sectional area of the metal layer 314 in the cross-section illustrated in FIG. 3A is greater than the cross-sectional area of the metal layer 214 in the background structure shown in FIG. 2 because of the existence of the wider lower portion 317. In addition, because the lower portion 317 now has a greater width in contact with the polysilicon layer 313, lower contact resistance is achieved. Contact resistance is defined as the resistance in the vertical direction between the top of the metal layer 314 and through the entire thickness of the metal layer 314 and the polysilicon layer 313. Contact resistance between a metal layer and a heavily doped polysilicon layer can be significant. Heavily doped polysilicon, although conductive, has a resistivity of about 1000 $\mu\Omega$.cm. Polysilicon is much more resistive than metals which typically have resistivity of less than about 50 $\mu\Omega$.cm. Making the lower portion 317 of the metal layer 314 wider that is in contact with the polysilicon layer 313 lowers the contact resistance by providing a metal layer 314 which has a greater horizontal cross-sectional area in contact with the polysilicon layer 313.

Figure 3B:
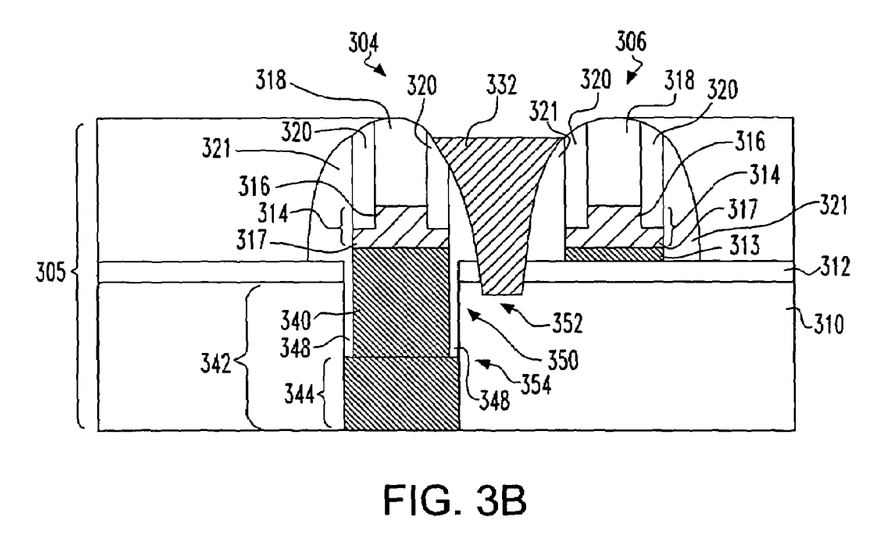
FIG. 3B is a cross-sectional view illustrating a pair of conductor lines according to an embodiment of the invention applied to the wordlines of a DRAM array, as combined with a borderless bitline contact disposed between the pair.

In a particular embodiment, substrate 310 may include trench capacitors, such as deep trench capacitors. Trench capacitors can be used for a number of purposes. Notably, trench capacitors are used as storage capacitors in storage cells of a DRAM. Other purposes exist, as well, such as for providing decoupling capacitance. FIG. 3B illustrates a particular embodiment in which a conductor line 304 functions as a wordline interconnected to a storage cell 305 of a DRAM. The storage cell 305 includes a pass-gate transistor and a storage capacitor. The wordline 304 is interconnected to the storage cell by a gate conductor 340 of a vertically oriented passgate transistor formed within an upper portion of a deep trench 342. The vertical transistor provides a switchable interconnection to a storage capacitor formed in region 344 of the trench below the vertical transistor. The vertical passgate transistor further includes a gate dielectric 348 and a channel region 350 operated by the gate conductor 340 through the gate dielectric 348, as well as a drain region 352 near the surface of array top oxide 312 and a source region 354 below the channel region 350.

As further shown in FIG. 3B, another conductor line 306 passes the area near the storage capacitor 344 but without having an interconnection to the storage capacitor 344 or the vertical transistor of a DRAM cell 305 including trench 342. This conductor line 306 is referred to as a passing conductor because of its lack of conductive interconnection at a particular DRAM cell of a DRAM storage cell array. The conductor line 306 is isolated from interconnection with the DRAM cell by the array top oxide 312. The conductor line 306 may connect to other DRAM cells of the DRAM storage cell array. Alternatively, where space is available within a DRAM array or at edges of such array, the conductor line 306 may serve another purpose. For example, the conductor line may provide interconnection to decoupling capacitors and/or to transistors provided for a purpose other than as passgates of DRAM storage cells.

As in the embodiment shown and described above relative to FIG. 3A, the embodiment shown in FIG. 3B includes a metal layer 314 formed above a polysilicon layer 313 in the case of passing conductor 306. In the case of conductor line 304, the metal layer 314 is formed above a gate conductor 340 which is composed of polysilicon. Other structure including cap layer 318, first sidewall spacers 320 and second sidewall spacers 321 appear as they did in the embodiment described above relative to FIG. 3A.

Figure 4:
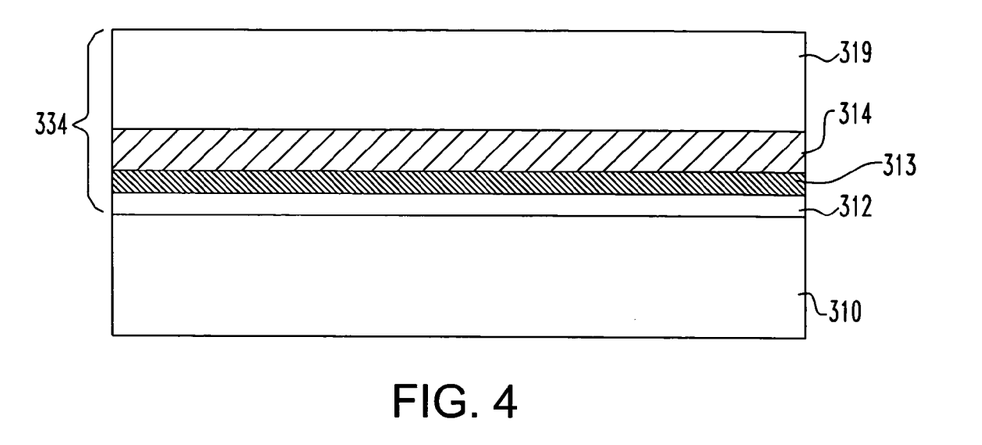
FIGS. 4 through 10 are cross-sectional views illustrating stages in fabricating conductor lines according to an embodiment of the invention.
Figure 10:
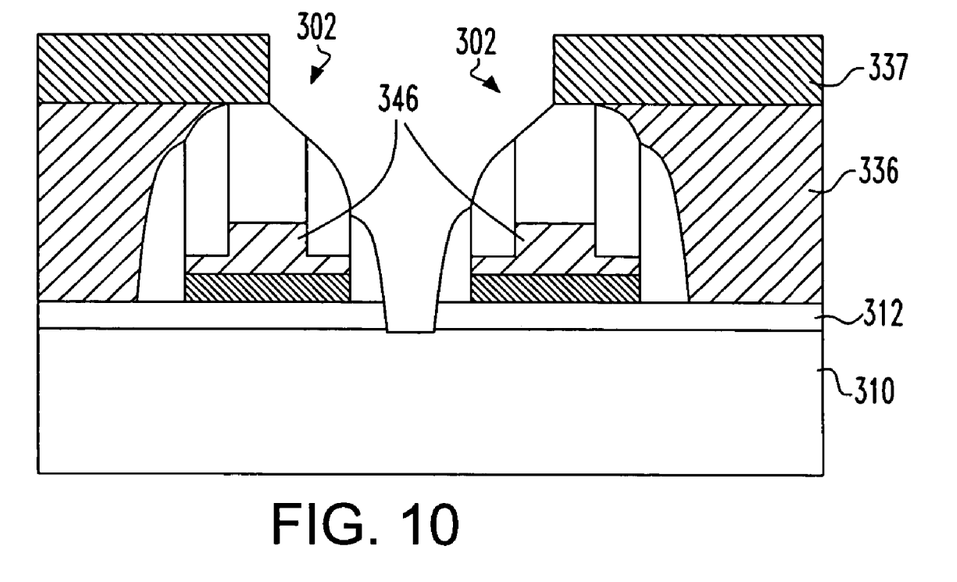

A method of forming conductor lines and a borderless contact to the substrate between the conductor lines will now be described, with reference to 3A through 10. As shown in FIG. 4, the method begins with a stack 334 of material layers on a substrate 310, each layer of the stack 334 being deposited successively over the layer deposited before it. The layered stack includes a dielectric layer 312, and a layer of doped polysilicon 313 formed on the dielectric layer 312. The dielectric layer 312 can be a gate dielectric, or alternatively, array top oxide of a DRAM storage cell array. As contemplated in a most preferred embodiment, conductor lines are to be used as wordlines of a DRAM storage cell array. In such DRAM storage cell array, the transistor of each storage cell is most preferably an n-type conductivity field effect transistor (NFET). For workfunction matching, the gate conductor of an NFET should best include a material having a workfunction that is close to that of the conductivity type of the transistor. Therefore, the polysilicon layer 313 most preferably is doped n-type, having a dopant concentration between about $10^{17}$ cm$^{-3}$ to about $10^{20}$ cm$^{-3}$.

The layered stack 334 further includes a "metal layer" 314 including one or more metals and/or one or more compounds of metals, for example, a metal silicide. A preferred metal for use in the metal layer 314 is tungsten (W), because chemical vapor deposition (CVD) processes exist for depositing tungsten, while many metals cannot be deposited by such technique. CVD is advantageous over available alternative deposition techniques such as physical vapor deposition (PVD) techniques for reasons related to time, cost and/or quality of processing. When the metal layer 314 includes only a metal silicide, tungsten silicide is a preferred metal silicide for the same or similar reasons that tungsten is a preferred metal. As indicated above, the metal layer 314 may include one or more additional layers such as a barrier layer and/or adhesion layer (or dual function barrier/adhesion layer) between different materials of the metal layer 314 and/or between the metal layer 314 and the polysilicon layer 313 that underlies it. Such barrier/adhesion layer can be composed of titanium nitride (TiN) or tantalum nitride (TaN), for example. In addition thereto, a deposition of titanium (Ti) having very short duration, e.g. less than one minute in duration, may be performed to create a "flash" titanium layer between respective layers of the metal layer 314 and/or between the metal layer 314 and the underlying polysilicon layer 313.

A dielectric material layer 319 is formed over the metal layer 314 for the purpose of being patterned to provide an insulating cap over the conductor line and for serving as a hardmask when the layered stack 334 is etched as follows to form conductor lines. The dielectric material layer 319 is preferably composed of silicon nitride. In an alternative embodiment, the dielectric material layer 319 can be composed of silicon dioxide instead.

Figure 5:
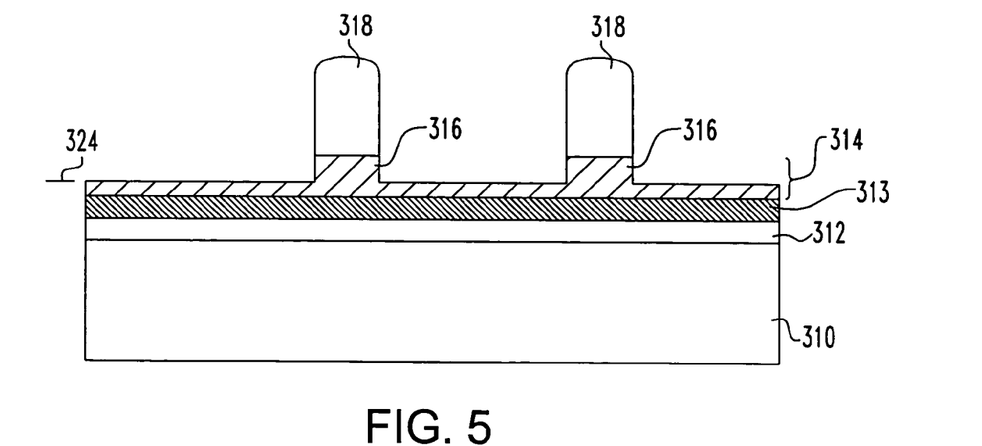

Next, as illustrated in FIG. 5, conductor line stacks are provided by directionally etching the layered stack structure 334 in the vertical direction, selectively to the material of the dielectric layer 319. Such etch is preferably performed by reactive ion etching (RIE). This etch is stopped at a level 324 that is between the bottom of the layer 314 in contact with the polysilicon layer 313 and the top of the layer 314 which is in contact with the dielectric cap material. The level 324 is preferably at about the midpoint between the bottom and the top of the layer 314.

There are many ways to accomplish stopping the etch at a particular level 324. For one, a timed etch can be employed. The timed etch has the advantage that it does not require finely controlled depositions of certain material layers within the metal layer 314 for use in end-pointing the etch. Alternatively, positive endpointing can be used which involves formation of a particular layer within metal layer 314 which can be distinguished during the etch process. For example, a distinguishable material can be provided at a certain point within metal layer 314 which produces a particular chemical signal when the etching process reaches it. For example, a nitride, e.g. TiN, or TaN, can be distinguished by a nitrogen-containing chemical signal (e.g. ammonia NH$_4$) when the etchant is selected appropriately. An advantage of a timed etch is that it does not require any such distinguishable layer to be formed within the metal layer 314, making it less costly to implement in terms of processing complexity. A disadvantage of the timed etch is that it is less well-controlled than other processes that provide positive endpointing, such that the timed etch can result in a greater margin of error for controlling the thicknesses of the upper portion and lower portion of the metal layer 314.

A third possible way of etching metal layer 314 only down to the desired level 324 is to perform etching selective to a distinguishable layer within metal layer 314 such that the etch process effectively slows to a very slow rate and/or stops on the distinguishable layer. This process can also be used in conjunction with a timed etch such that the two methods complement each other, the timed etch shutting down etching if the endpoint is not reached there prior. Such distinguishable layer can again be composed of a conductive nitride such as of TiN and/or TaN. An advantage to this approach is that the level 324 can be more precisely reached than by a timed etch alone.

Figure 6:
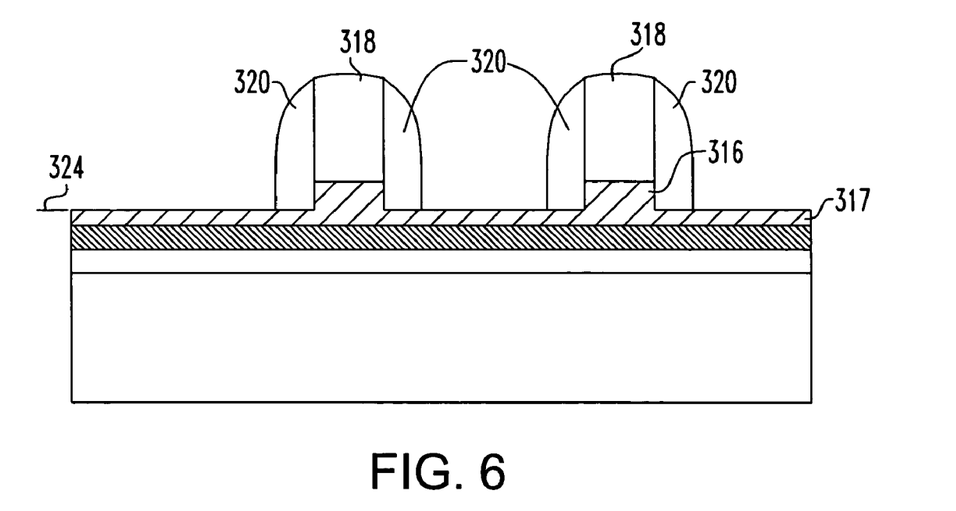

Next, as shown in FIG. 6, sidewall spacers 320 of dielectric material are formed on sidewalls of the insulating caps 318. The sidewall spacers are formed by the following process. A conformal layer of material is deposited over the structure having the exposed insulating caps 318 and lower portion 317 of the metal layer 314. Next, a directional etch such as RIE is used to vertically etch the structure down to the level 324 of the lower portion 317.

Figure 7:
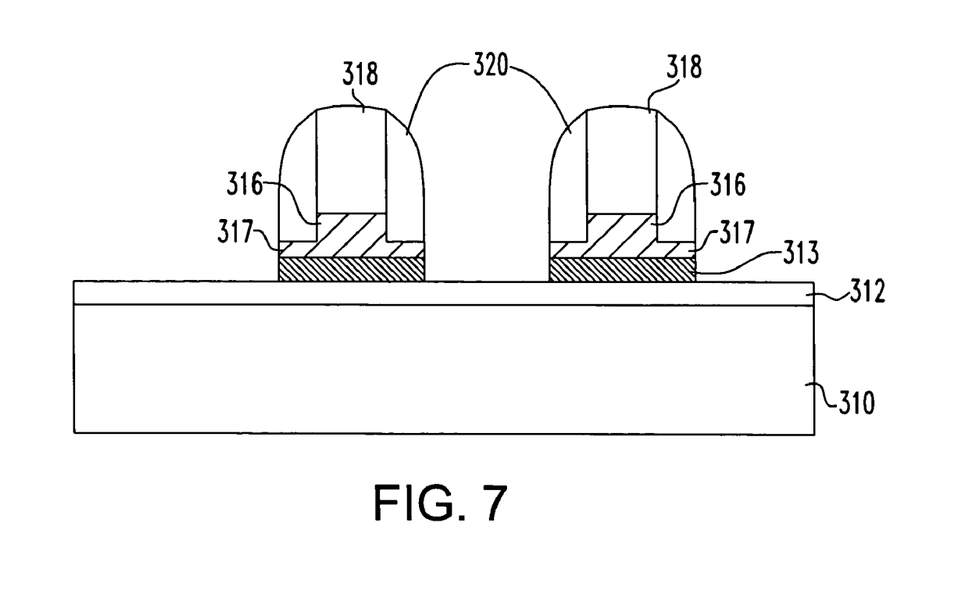

Next, as shown in FIG. 7, the lower portion 317 of the metal gate layer 314 and the polysilicon layer 313 are removed from all areas except where they are protected under other structure including insulating cap 318 and sidewall spacers 320. The etch is preferably performed by RIE, stopping on the dielectric layer 312 disposed below the polysilicon layer 313 such that the lower portion 317 and polysilicon layer 313 of the conductor lines are etched down to the dielectric layer 312. The sidewall spacers 320 are preferably composed of silicon nitride. The sidewall spacers are preferably etched in this step by continuing the etch directionally by RIE, stopping on the dielectric layer 312 disposed below the polysilicon layer 313.

Figure 8:
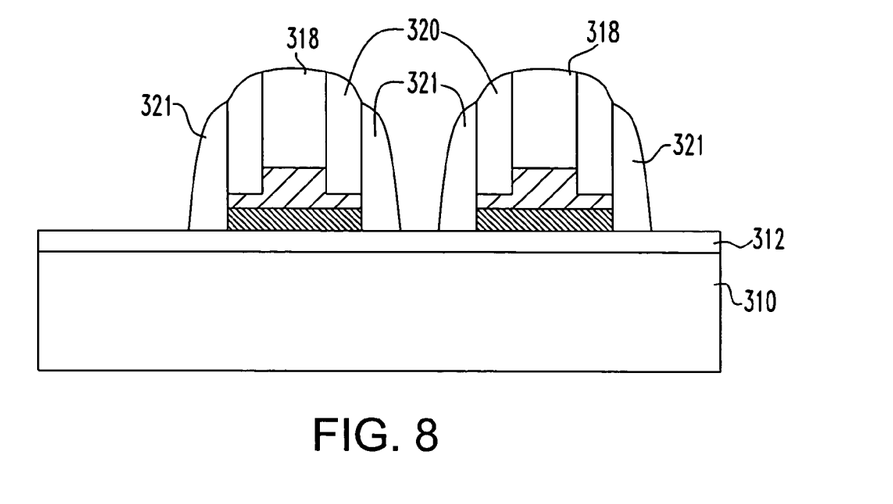

Next, as shown in FIG. 8, a second pair of sidewall spacers 321 are formed on sidewalls of the structures illustrated in FIG. 7. Stated another way, the second pair of spacers 321 is formed on sidewalls of the first pair of spacers 320, the metal layer 314 and the polysilicon layer 313 that underlies the metal layer 314. These spacers are preferably composed of the same material of which spacers 320 are composed. A preferred material of the spacers 321 is silicon nitride for providing etch selectivity relative to an oxide for a subsequent bitline contact etch (FIG. 10), when a gap-filling dielectric material that is formed between the conductor lines consists essentially of an oxide. The sidewall spacers 321 are preferably formed by the following process. A conformal layer of material is deposited over the structure having the exposed insulating caps 318 and first spacers 320. Next, a directional etch such as RIE is used to vertically etch the structure down to the level of the dielectric layer 312.

Figure 9:
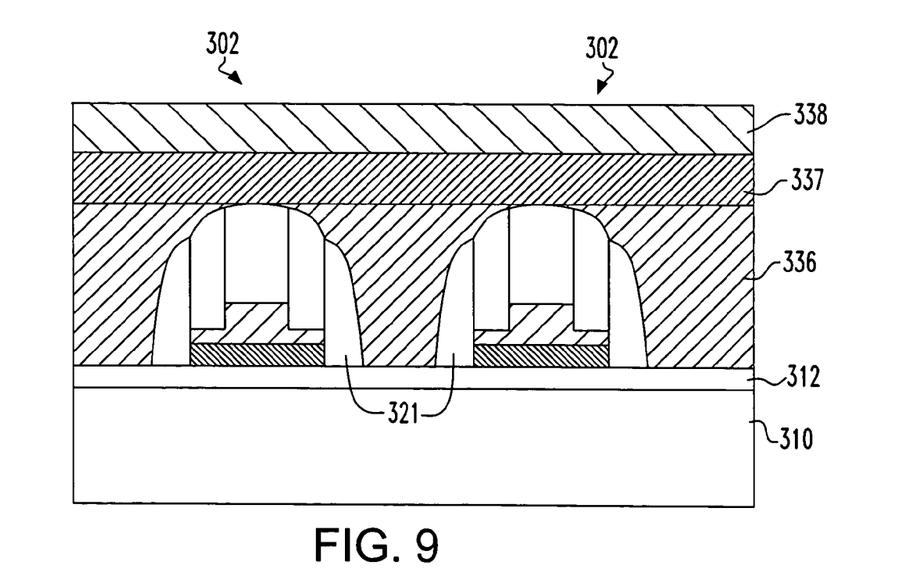

Next, as shown in FIG. 9, a dielectric gap fill material 336 is deposited to fill the gap between respective second spacers 321 of conductor line stacks 302. The gap fill material is desirably selected for properties in filling the gap between adjacent conductor line stacks 302 which generally has high aspect ratio, "high aspect ratio" meaning that the ratio of height to width is greater than two. Conventional processes such as CVD, evaporation, spin-on-coating, etc. can be used to deposit the gap fill material 336. Examples of appropriate gap fill materials that can be deposited by CVD include but are not limited to borophosphosilicate glass (BPSG) and arsenic doped glass (ASG).

Thereafter, a further dielectric material layer 337 is deposited over the gap fill material 336. When the sidewall spacers 320, 321 are formed of silicon nitride, the dielectric material layer 337 preferably includes an oxide for distinguishing etch selectivity for the sidewall spacers 320, 321 which are to remain after the holes for the borderless bitline contacts are etched. Such dielectric material layer 337 is commonly referred to as an oxide cap 337.

As further shown in FIG. 9, thereafter, a hardmask layer 338 is deposited over the oxide cap layer 337. The hardmask layer 337 preferably includes one or more oxide layers. Thereafter, a conventional photoresist (not shown) is then formed on top of the hardmask and a contact hole is patterned in the photoresist by conventional lithography.

Thereafter, with reference to FIG. 10, contact holes are etched between the conductor lines 302 through the dielectric layer 312 to the substrate 310. Such contact holes can be etched either according to vertical-oriented via patterns in a photoresist pattern above the hardmask layer 338, or according to linearly extending line-mask patterns. In a preferred embodiment, the contact holes are alternating line-space patterns (not shown) which extend in the left-right orientation of the FIG. 10. This can be accomplished as follows. A photoresist layer (not shown) is exposed with a line-space pattern of a mask, and thereafter the exposed resist layer is developed. An etching step is then performed to transfer the line space pattern to the hard mask. The etching step also removes a portion of the cap oxide layer 337. Next, the etch between the conductor lines 302 is performed, preferably by reactive ion etch. The etching includes the steps of etching oxide cap layer, dielectric material.

As a result of the etching, the spacers 321 and possibly spacers 320 that insulate the metal layer 314 and polysilicon layer 313 are subject to being eroded. However, since in the present embodiment, more space is available between the outer (second) spacers 321 of the conductor lines 302, there is less chance that the protective spacers covering the corners 346 will be eroded to the point that a borderless contact formed in such contact hole will short-circuit to one or more of the conductor lines 302.

A layer of one or more materials generally including polysilicon deposited to contact substrate 310, followed by one or more of metals and/or metal compounds such as metal suicides are then deposited into the contact hole to form a conductive contact to the substrate, as shown in FIGS. 3A and 3B.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A conductor line stack, comprising:
    a first conductive layer consisting essentially of at least one first material selected from the group consisting of polysilicon and metal silicides;
    a second conductive layer consisting essentially of at least one second material said second conductive layer being in conductive communication with said first conductive layer, said second layer having an upper portion and a lower portion;
    an insulating cap overlying said second layer, said insulating cap having sidewalls aligned with sidewalls of said upper portion; and
    a pair of first spacers disposed on sidewalls of said upper portion and on said aligned sidewalls of said insulating cap, said lower portion having width defined by a width of said upper portion combined with a width of said pair of first spacers from said aligned sidewalls of said insulating cap.

2. The conductor line stack of claim 1, wherein said second material includes a metal.

3. The conductor line stack of claim 1, further comprising second spacers disposed on sidewalls of said first spacers, on sidewalls of said lower portion and on sidewalls of said first conductive layer.

4. A conductor contact structure including a conductor line stack as claimed in claim 3, further comprising a borderless bitline contact to a single-crystal semiconductor region disposed below said conductor line stack, said bitline contact having a sidewall contacting a sidewall of said second spacer.

5. A conductor contact structure including a pair of conductor line stacks as claimed in claim 3, said conductor line stacks being oriented in parallel, said conductor contact structure including a borderless bitline contact to a single-crystal semiconductor region disposed below said pair of conductor line stacks, said bitline contact contacting sidewalls of said second spacers of said conductor line stacks.

6. The conductor contact structure of claim 5 wherein said borderless bitline contact includes heavily doped polysilicon.

7. The conductor contact structure of claim 5 wherein a first conductor line stack of said pair of conductor line stacks is separated from said single-crystal semiconductor region by an array top oxide layer and a second conductor line stack of said pair of conductor line stacks is conductively coupled to a gate conductor of a vertical passgate transistor of a dynamic random access memory.

8. The conductor line stack as claimed in claim 1 further comprising an etch stop layer disposed between said upper portion and said lower portion of said second conductive layer, said etch stop layer including a third material which is substantially not attacked by an etchant which attacks said second material.

9. The conductor line stack as claimed in claim 1 further comprising an etch distinguishable layer disposed between said upper portion and said lower portion of said second conductive layer, said etch distinguishable layer including a third material which produces a chemical signal when contacted by an etchant which attacks said second material.

10. A conductor line stack, comprising:
a first conductive layer consisting essentially of a doped polysilicon;
a second conductive layer overlying said first conductive layer and in conductive communication with said first conductive layer, said second conductive layer consisting essentially of at least one second material selected from the group consisting of metals and conductive compounds of metals, said second conductive layer having an upper portion and a lower portion;
an insulating cap overlying said second conductive layer, said insulating cap having sidewalls aligned with sidewalls of said upper portion; and
a pair of first spacers disposed on sidewalls of said upper portion and on said aligned sidewalls of said insulating cap, said lower portion having width defined by a width of said upper portion combined with a width of said pair of first spacers from said aligned sidewalls of said insulating cap.

11. The conductor line stack of claim 10, further comprising second spacers disposed on sidewalls of said first spacers, on sidewalls of said lower portion and on sidewalls of said first conductive layer.

12. A conductor contact structure including a conductor line stack as claimed in claim 11, further comprising a borderless bitline contact to a single-crystal semiconductor region disposed below said conductor line stack, said bitline contact having a sidewall contacting a sidewall of said second spacer.

13. A conductor contact structure including a pair of conductor line stacks as claimed in claim 11, said conductor line stacks being oriented in parallel, said conductor contact structure including a borderless bitline contact to a single-crystal semiconductor region disposed below said pair of conductor line stacks, said bitline contact contacting sidewalls of said second spacers of said conductor line stacks.

14. The conductor contact structure of claim 13, wherein said borderless bitline contact includes doped polysilicon.

15. The conductor contact structure of claim 13, wherein a first conductor line stack of said pair of conductor line stacks is separated from said single-crystal semiconductor region by an array top oxide layer and a second conductor line stack of said pair of conductor line stacks is conductively coupled to a gate conductor of a vertical passgate transistor of a dynamic random access memory.

16. The conductor line stack as claimed in claim 10 further comprising an etch stop layer disposed between said upper portion and said lower portion of said second conductive layer, said etch stop layer including a third material which is substantially not attacked by an etchant which attacks said second material.

17. The conductor line stack as claimed in claim 10 further comprising an etch distinguishable layer disposed between said upper portion and said lower portion of said second conductive layer, said etch distinguishable layer including a third material which produces a chemical signal when contacted by an etchant which attacks said second material.

18. A conductor contact structure comprising:
a pair of conductor line stacks oriented in parallel, each said conductor line stack including:
a first conductive layer consisting essentially of at least one first material selected from the group consisting essentially of doped polysilicon;
a second conductive layer consisting essentially of at least one second material selected from the group consisting of metals and metal silicides said second conductive layer being in conductive communication with said first conductive layer, said second conductive layer having an upper portion and a lower portion;
an insulating cap overlying said second conductive layer, said insulating cap having sidewalls aligned with sidewalls of said upper portion; and
a pair of first spacers disposed on sidewalls of said upper portion and said insulating cap, said lower portion having width defined by a width of said upper portion combined with a width of said pair of first spacers from said aligned sidewalls of said insulating cap; and
a pair of second spacers disposed on sidewalls of said first spacers, on sidewalls of said lower portion and on sidewalls of said first conductive layer;
a borderless bitline contact to a single-crystal semiconductor region disposed below said pair of conductor line stacks, said bitline contact contacting sidewalls of said second spacers of said conductor line stacks,
wherein a first conductor line stack of said pair of conductor line stacks is separated from said single-crystal semiconductor region by an array top oxide layer and a second conductor line stack of said pair of conductor line stacks is conductively coupled to a gate conductor of a vertical passgate transistor of a dynamic random access memory.

19. The conductor contact structure as claimed in claim 18 further comprising an etch stop layer disposed between said upper portion and said lower portion of said second conductive layer, said etch stop layer including a third material which is substantially not attacked by an etchant which attacks said second material.

20. The conductor contact structure as claimed in claim 18 further comprising an etch distinguishable layer disposed between said upper portion and said lower portion of said second conductive layer, said etch distinguishable layer including a third material which produces a chemical signal when contacted by an etchant which attacks said second material.

* * * * *